United States Patent

Kataoka et al.

[15] 3,691,481

[45] Sept. 12, 1972

[54] NEGATIVE RESISTANCE ELEMENT

[72] Inventors: Shoei Kataoka, Hiroshi Tateno, both of Tokyo-to; Hiroyuki Fujisada, Tokyo-to; Mitsuo Kawashima, Tokyo-to; Yasuo Komamiya, Hideo Yamada, Yokohama, all of Japan

[73] Assignee: Kogyo Gijutsuin (a/k/a "Agency of Industrial Science and Technology, Ministry of International Trade and Industry, Japanese Government"), Tokyo-to, Japan

[22] Filed: July 29, 1971

[21] Appl. No.: 167,410

Related U.S. Application Data

[63] Continuation-in-part of Ser. No. 776,292, Aug. 20, 1968, abandoned.

[30] Foreign Application Priority Data

| | | |
|---|---|---|
| Aug. 22, 1967 | Japan | 42/53488 |
| Nov. 27, 1967 | Japan | 42/75628 |
| Nov. 27, 1967 | Japan | 42/75629 |
| Nov. 27, 1967 | Japan | 42/75630 |
| Nov. 27, 1967 | Japan | 42/75631 |

[52] U.S. Cl............331/107 G, 307/299, 317/234 V, 330/5

[51] Int. Cl................H03b 7/14

[58] Field of Search.............331/107 G; 317/234 V; 307/299; 330/5

[56] References Cited

UNITED STATES PATENTS

| | | | |
|---|---|---|---|
| 3,365,583 | 1/1968 | Gunn | 317/234 |
| 3,434,008 | 3/1969 | Sandbank | 317/234 |
| 3,439,236 | 4/1969 | Blicher | 317/234 |
| 3,443,169 | 5/1969 | Foxell et al. | 317/234 |
| 3,452,222 | 6/1969 | Shoji | 317/234 |
| 3,462,617 | 8/1969 | Shoji | 317/234 |

*Primary Examiner*—Roy Lake
*Assistant Examiner*—Darwin R. Hostetter
*Attorney*—Robert E. Burns et al.

[57] ABSTRACT

Occurrence of high field domain in the conventional Gunn diode is prevented by covering a solid body such as a semiconductor element partially or wholly by a dielectric member or by a control element such as a metallic layer coupled reactively with the solid body through a dielectric member, whereby a solid state element having a negative differential conductivity is obtained. Such a type of negative-resistance solid state element, together with its various modes of embodimental construction disclosed herein, affords a superior solid state element which is applicable to amplifiers, oscillators, logic memories, and the like of millimeter or submillimeter bands.

31 Claims, 77 Drawing Figures

FIG. 8(a)
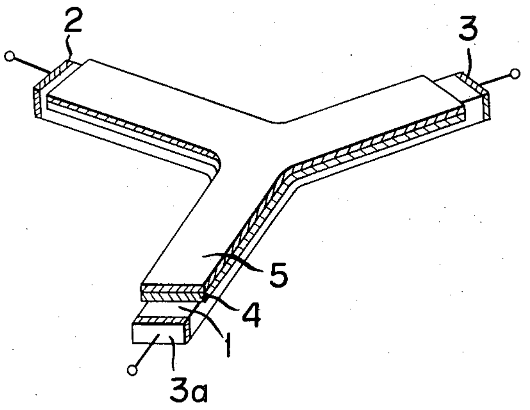
FIG. 8(b)
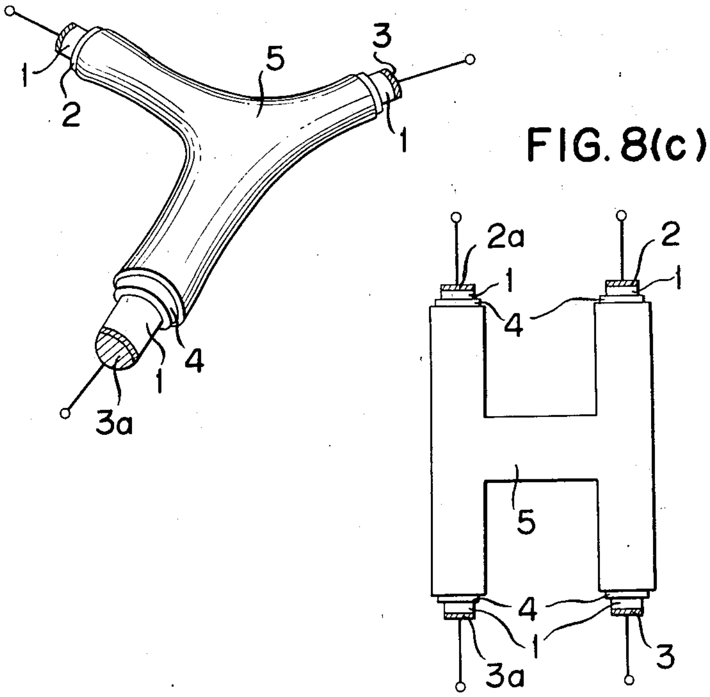
FIG. 8(b), FIG. 8(c)

NEGATIVE RESISTANCE ELEMENT

REFERENCE TO RELATED APPLICATION

This application is a continuation-in-part of our copending application Ser. No. 776,292 filed Aug. 20, 1968, and now abandoned for "NEGATIVE REGISTANCE ELEMENT AND ITS APPLICATION."

BACKGROUND OF THE INVENTION

This invention relates to a novel type of negative-resistance solid state element, and more particularly to such type of element that exhibits negative differential conductivity upon application thereto of a high electric field and to applications thereof.

Heretofore, negative-resistance elements such as the so-called Ezaki diode, which utilize a tunnel effect of semiconductors, have been known. However, in the Ezaki diode, since the negative resistance is obtained at the P-N junction of the semiconductive substances, the negative differential conductivity is exhibited only for a specific polarity, and because of the capacitance existing at the junction point, the element cannot be used at frequencies higher than 10 GHz. These features together with its limited output power constitute the drawbacks of this type of diode.

The so-called Gunn diode is also known, wherein a semiconductive material such as GaAs which has two valleys in its conduction band is employed. When a high electric field is applied across such an element, electrons are transferred from the lower energy valley to the higher energy valley, and because mobility of the electrons in the higher energy valley is less than the mobility in the lower energy valley, the average speed of electrons decreases with increase in electric field. When the intensity of the internal electric field applied from outside as described above exceeds a critical value (about 3,000 V/cm), a high field domain is created near the cathode, which is thereafter shifted to the anode by the action of the applied electric field. When the high field domain reaches the anode, it disappears at once, and an impulsive current is caused to flow through the semiconductive substance because of the disappearance of the high field domain. Following this disappearance, new high field domain is created near the cathode and the same sequences mentioned above are repeated at a frequency determined by the length of the element.

This typs of solid state element can be utilized in generating high-frequency oscillation of a frequency determined by $l/v_d$, wherein $l$ designates the length of the element, and $v_d$ designates the velocity of the high field domain. Considering the fact that the velocity $v_d$ of the high field domain is about $10^7$ cm/sec., it is apparent from this formula that the length of the element must be minimized to an extremely short value (of the order of several microns) if it is desired to obtain micro-wave or millimeter wavelength.

Despite various efforts to obtain still higher frequencies than those described above, it has been found that the practical limitation exists around several tens of GHz, and the resultant oscillation output is rapidly decreased with increase in the frequency. Such features together with its excessively narrow frequency band constitute drawbacks of the Gunn type solid element.

The so-called LSA diode is also known. It is believed that with this type of diode further increase in the oscillation frequency can be attained with a moderate efficiency. However, in this case, since the biasing electric field must be higher than twice the value of the Gunn diode, the semiconductive material must be of extremely uniform quality, and, moreover, as there is a limitation in the relationship between the electron density and frequency, these are other features constituting the shortcomings of the LSA diode.

We have found that, if one or whole part of the surface of a semiconductive element of, for instance, GaAs, is covered by a dielectric layer or a metallic layer which is reactively coupled with the semiconductive element through an intermediate dielectric thin layer, the occurrence of the high field domain at the time when a high electric field is applied thereacross can be prevented, and a novel condition which might be called "negative-differential resistance characteristic" or "negative differential conductivity" can be obtained.

SUMMARY OF THE INVENTION

With the above-described discovery in view, the principal object of the present invention is to provide a novel type negative-resistance solid state element, whereby the afore-described difficulties in conventional elements are substantially reduced or eliminated.

Another object of the present invention is to provide a novel type of solid state element, which is operable under an entirely new principle completely differing from those of the conventional elements, whereby oscillation in a range of from extremely low frequency to 300 GHz can be obtained.

Still another object of the present invention is to provide a novel type of solid state element, which is operable under an entirely new principle and having a completely new configuration, whereby a much improved negative differential conductivity is obtained, and the element is made applicable to a wide variety of applications such as in oscillation, amplification, and logic memory.

The above stated objects and other objects of the present invention can be accomplished by a novel type of negative-resistance solid state element which comprises: a semiconductive element showing negative differential conductivity in a high electric field and having at least two end portions; a plurality of electrodes ohmically attached to the semiconductive element at least two end portions for application of an electric voltage causing production of said high electric field; and a dielectric member or this dielectric member and at least one control element which cover at least one part of said semiconductor element, said control element being reactively coupled with said semiconductor element through said dielectric member, whereby the high field domain created in the semiconductive element is suppressed at the time when a high electric voltage is applied across the electrodes and a negative differential conductivity is created within the bulk of the semiconductive element.

The nature, principle, and advantages of the present invention will become more apparent from the following description and appended claims, when considered in conjunction with the accompanying drawings, wherein the same reference numerals refer to like or corresponding parts throughout the several views.

BRIEF DESCRIPTION OF THE DRAWINGS

FIGS. 8(*a*) through 8(*c*) illustrate still further embodiments wherein the solid element is provided with more than two ends, to which the corresponding number of electrodes are ohmically attached.

FIG. 9(*b*) is a characteristic curve for describing operation of the embodiment of FIG. 9(*a*);

FIG. 9(*c*) illustrates an oscillation circuit to which the embodiment of FIG. 9 is applied;

FIGS. 9(*d*) through 9(*l*), and 9(*o*) illustrate, respectively, different modifications of the embodiment of FIG. 9(*a*);

FIGS. 9(*m*) and 9(*p*) show schematic circuits equivalent to the embodiments of FIGS. 9(*l*) and 9(*o*), respectively;

FIG. 9(*n*) is characteristic curves for showing control operation of the embodiment of FIG. 9(*l*);

FIG. 13(*b*) is circuit equivalent to the construction of FIG. 13(*a*);

FIGS. 13(*c*), 13(*d*), and 13(*e*) are different modifications of the embodiment of FIG. 13(*a*);

FIG. 13(*f*) is a still further embodiment of this invention, in which air gaps as shown in FIGS. 13(*c*) and 13(*d*) are provided;

FIGS. 15(*e*), 15(*f*) and 15(*g*) are, respectively, sectional views along a line X—X of FIGS. 15(*a*), 15(*b*) and 15(*c*); and 15(*h*) shows three different forms of the semiconductor element to be used in the embodiments of FIGS. 15(*a*) through FIG. 15(*d*).

DETAILED DESCRIPTION

Figure 1A:
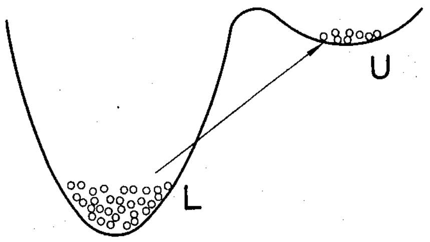
FIGS. 1(*a*) through 1(*e*) are explanatory diagrams to be used for an explanation of the conventional Gunn diode.
Figure 1B:
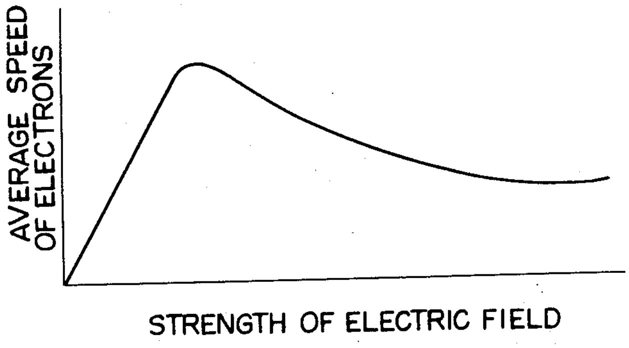
Figure 1C:
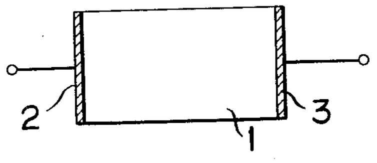
Figure 1D:
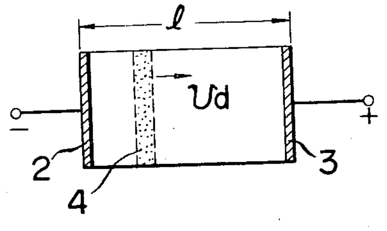
Figure 1E:
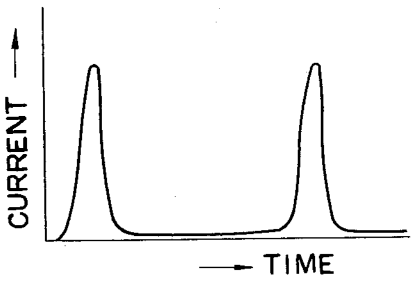

Referring first to FIGS. 1(*a*) through 1(*e*) showing explanatory diagrams to be employed for an explanation of the conventional Gunn diode, there is illustrated a semiconductor element such as GaAs which has two valleys in its electron conduction band (see FIG. 1(*a*)), and because one valley of lower energy has much higher electron mobility than that of the higher energy valley, if such a semiconductor element 1 (see FIG. 1(*b*)) is provided with two electrodes 2, 3 ohmically connected at both ends, and a d.c. high voltage is applied across these electrodes 2, 3, the average speed of the electrons which were at first in the lower energy valley will gradually increase as shown in FIG. 1(*b*). However, if the applied voltage exceeds a certain critical value, the electrons will start to be transferred to the higher energy valley, and since the mobility of the electrons there in is much lower than that of the first valley, the average speed of the electrons will decrease as shown in the same drawing.

This decrease of the average speed of the electrons should cause negative differential conductivity within the bulk of the semiconductor element but for the creation of a high field domain as described before. The high field domain is in itself a dipole layer of space charges or a region whereacross a high electric field appears. This high field domain is created at first at a position near the cathode 2 when the internal electric field of the semiconductor element 1 exceeds a critical value of approximately 3,000 v/cm (in GaAs), and the domain is shifted toward anode 3 at a velocity of $v_d$. The creation of the high field domain causes a decrease in the electric field in other part of the semiconductor element than at the high field domain provided that a constant voltage is applied to the semiconductor element and the current flowing through the semiconductor element 1 is decreased as shown in FIG. 1(*e*).

When the high field domain reaches the anode 3, it disappears at once. The disappearance of the high field domain causes the resistance of the semiconductor element 1 to decrease, and the current flowing therethrough is increased as indicated by the pulse-like peaks in FIG. 1(*e*). This type of current oscillation is called "Gunn oscillation" and has been used widely in conjunction with a tuning circuit. The Gunn diode, however, does not show a negative resistance characteristic except at a particular frequency determines by the electron transit time.

Figure 2A:
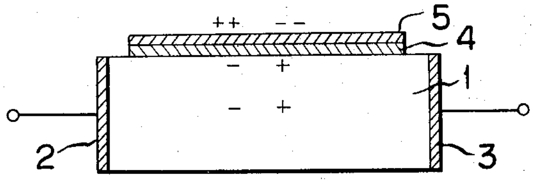
FIGS. 2(*a*) and 2(*b*) are explanatory diagrams for showing the principle of this invention.
Figure 2B:
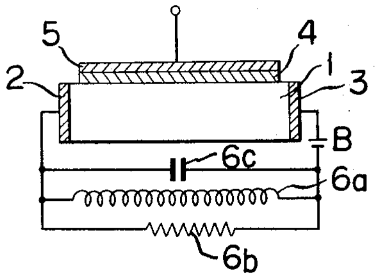

Referring now to FIG. 2(*a*) which illustrates the principle of this invention, a solid state element comprises a semiconductor element 1, electrodes attached to both ends of the semiconductor element, a dielectric member 4, and a metallic layer 5 (control element) which is reactively coupled with the semiconductor element 1 through an intermediately interposed thin layer of the dielectric member 4. In this arrangement, when a d.c. high voltage is applied across the electrodes 2 and 3, and if the value exceeds a certain critical value, the formation of high field domains due to the space charges will now be prevented by the existence of both the dielectric member 4 and the metallic layer 5 which act as capacitors, and the negative differential conductivity will be exhibited in the bulk of the semiconductor element 1. Since this feature of the present invention of negative differential conductivity is obtained not in the local junction layer as in the conventional diodes but within the whole or part of the bulk of the semiconductor element 1, a far larger value of the output can be obtained with much improved efficiency, and this possibility opens up various fields of applications in the high-power ultra-high-frequency technique.

FIG. 2(*b*) illustrates an example of such applications wherein a tuning circuit is connected across the electrodes 2 and 3, and when the d.c. high voltage applied between the same electrodes exceeds a critical value, an ultra-high frequency oscillation is created, the oscillation output being obtained also between the same electrodes 2 and 3.

In another embodiment of this kind, the high d.c. voltage applied across the electrodes 2 and 3 is kept at a value a little lower than the voltage at which the oscillation is created, and a signal voltage is applied at the metallic layer 5 which in this case acts as a control element. The inside electric field is thus affected by the signal voltage applied at the control element, and an alternating negative resistance of the amplitude and frequency corresponding to the input signal is obtained. This characteristic together with the aforementioned nature of this type of solid element susceptible to wide range of frequency bands affords a superior amplifier applicable to millimeter and submillimeter ranges.

Likewise, the above described solid state element applied with the high-d.c. voltage maintained at a condition at which it is just about to start oscillation is further applied by an impulsive voltage at the control element, i.e., the metallic layer 5, whereby the solid state element can be brought into the oscillating state. On the contrary, when the negative pulse signal is applied to the solid state element, it is brought into a non-oscillating state. Thus, a logic memory element is obtained.

Figure 3A:
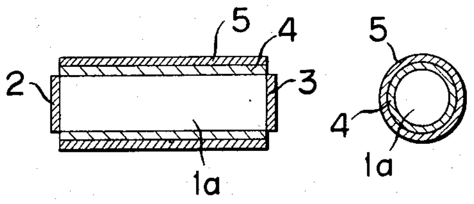
FIGS. 3(*a*) through 3(*c*) illustrate some typical embodiments of the negative-resistance solid state element according to the present invention.
Figure 3B:
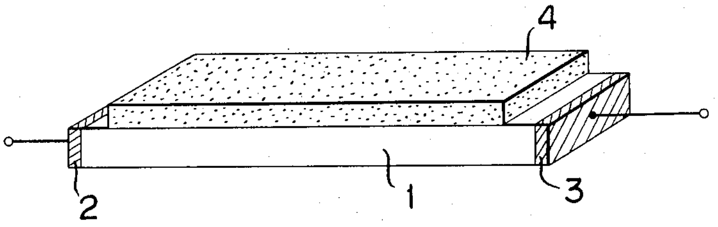
Figure 3C:
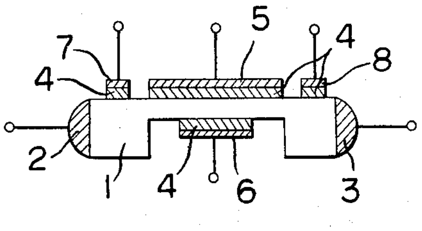

The above described provision of metallic layer 5 can be carried out in any of various ways such as providing it only on one side or on both sides of a planar semiconductor element 1, or around the peripheral surface of a cylindrical semiconductor element 1*a* as shown in FIG. 3(*a*), or the layer 5 can be provided along substantially the whole longitudinal length or along one part of the longitudinal length.

Otherwise, the negative-resistance diode is further provided with a pair of output terminals 7 and 8 as shown in FIG. 3(*c*) so that they are attached reactively at the portions near the electrodes 2 and 3, respectively, whereby the output from the diode may be taken out of the terminals 7 and 8.

For the purpose of enabling skilled persons in the art to understand and readily reduce this principle in practice, the following actual example is shown.

A planar GaAs semiconductor element was prepared from material of doping density $n_o = 6 \times 10^{13}$ cm$^{-3}$ and mobility of 8,000 cm$^2$/Vs in a dimension of 1 mm long, 250 $\mu$m thick, and 500 $\mu$m wide. At both ends of the element, Au-Ge metal electrodes were ohmically attached by evaporative deposition. When a d.c. voltage of 320 v was applied to the element across the electrode, the current flowing through the element exhibited frequency of about 100 MHz due to travelling domain-mode current oscillation. When a metal plate is attached to this GaAs element through a sheet of "-Myler" as the dielectric material having thickness of 4 $\mu$m and relative permittivity of 2.2, no travelling domain-mode current oscillation appeared. Furthermore, result of measurement of the field distribution in the interior of the element by means of capacitance probing revealed that no high field domain existed, and that a d.c. field distributed more at the anode side.

Figure 4A:
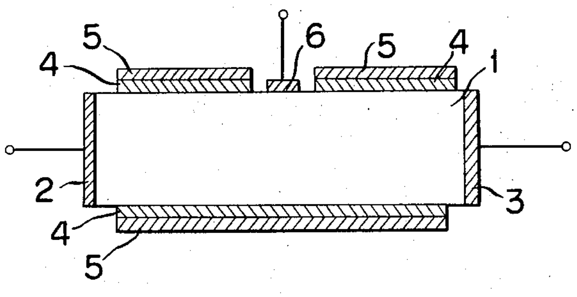
FIGS. 4(*a*) and 4(*b*) illustrate other embodiments each having a third electrode which can be used as an input terminal of this kind of negative-resistance solid state element according to this invention.
Figure 4B:
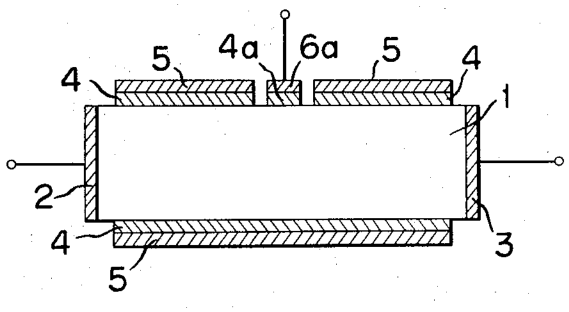

Furthermore, the principle according to the present invention can be applied in the realization of another novel type element wherein a third electrode operable as a control electrode is provided. The construction of such a type of solid state element is shown in FIGS. 4(*a*) and 4(*b*). In the drawing, the semiconductor element 1 having ohmically connected electrodes 2, 3 at its opposite ends and a metallic layer 5 reactively coupled to the semiconductor element 1 through a dielectric layer 4, and showing negative differential conductivity in its operation, is further provided with an ohmically attached third electrode 6 (see FIG. 4(*a*)) or a reactively coupled third electrode 6*a* (see FIG. 4(*b*)) through a dielectric layer 4*a* which is similar to the dielectric layer 4 for the metallic layer 5.

Figure 5A:
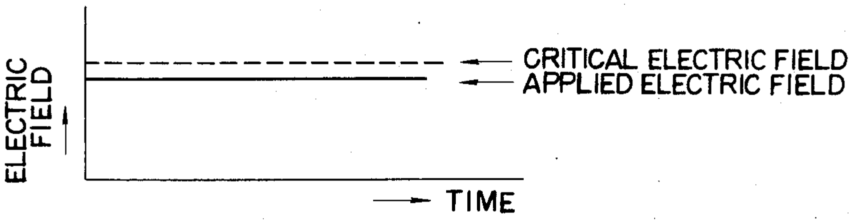
FIGS. 5(*a*) through 5(*d*) are explanatory diagrams showing the principle of operation of the negative-resistance solid state element having a third electrode which can be employed as an input terminal.
Figure 5B:
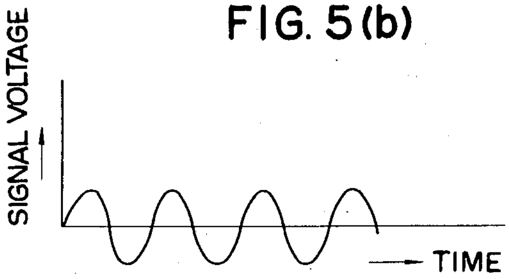
Figure 5C:
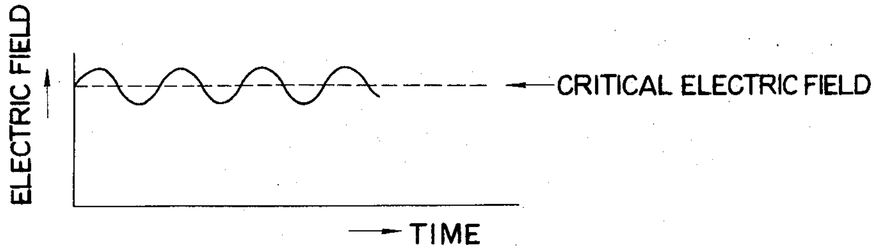
Figure 5D:
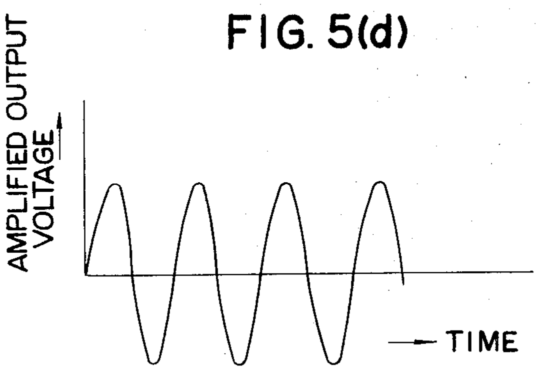

If a high d.c. voltage of a value nearly equal to the critical value (FIG. 5(*a*)) is applied across the ohmically attached electrodes 2, 3, and a signal voltage (see FIG. 5(*b*)) is applied on the third electrode 6 or 6*a*, then the electric field internal of the semiconductor element 1 will vary in accordance with the combined two voltages (FIG. 5(c)), and the electric signal will thereby be amplified as indicated by FIG. 5(*d*), the amplified signal appearing across the electrodes 2, 3.

Figure 6A:
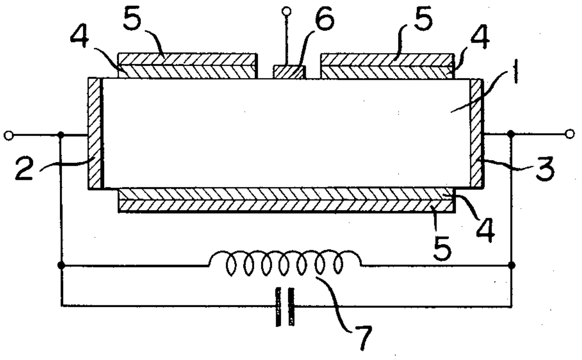
FIGS. 6(*a*) through 6(*c*) are explanatory diagrams to be used for showing the operation of the negative-resistance solid state element having the third electrode.
Figure 6B:
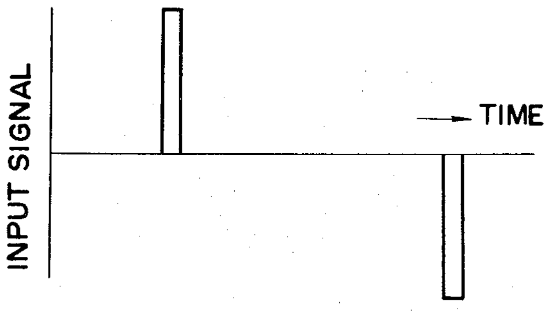
Figure 6C:
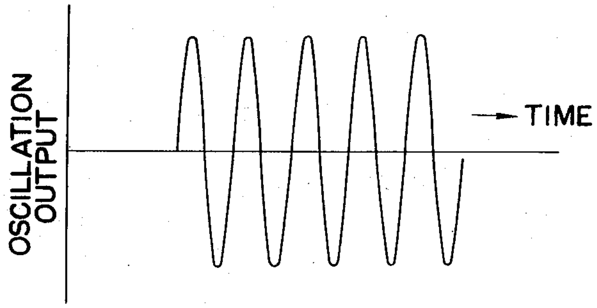
Figure 7A:
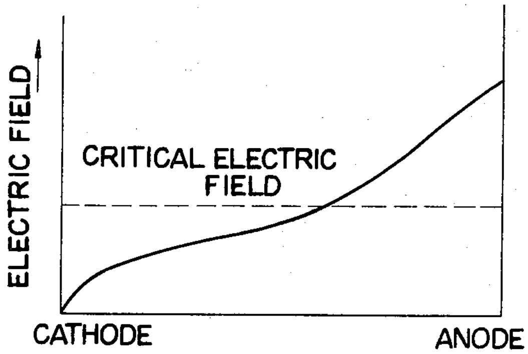
FIGS. 7(*a*) through 7(*l*) illustrate further embodiment of the negative-resistance solid state element according to the present invention, wherein the sectional area of the semiconductive element is enlarged at its one or at both ends.
Figure 7B:
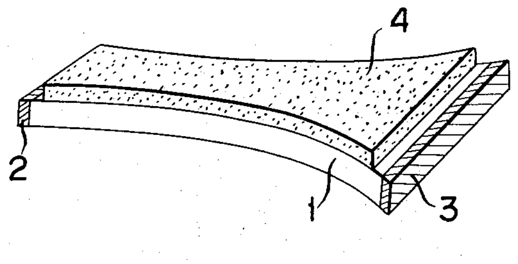
Figure 7C:
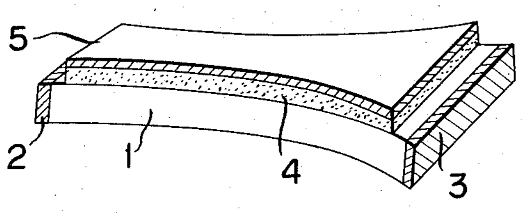
Figure 7D:
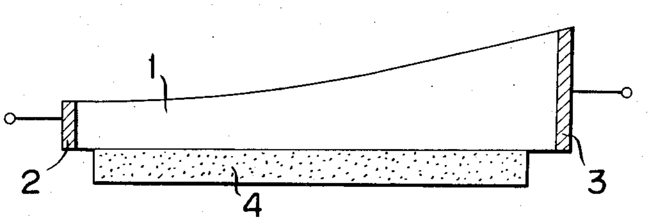
Figure 7E:
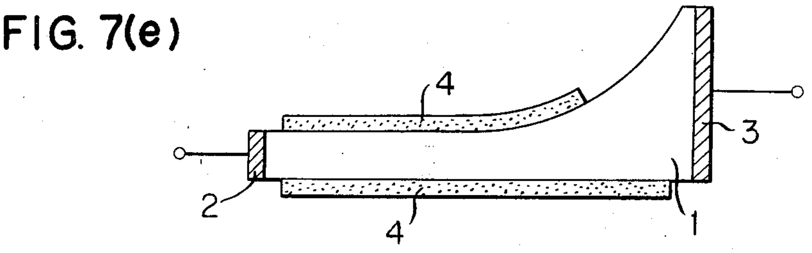
Figure 7F:
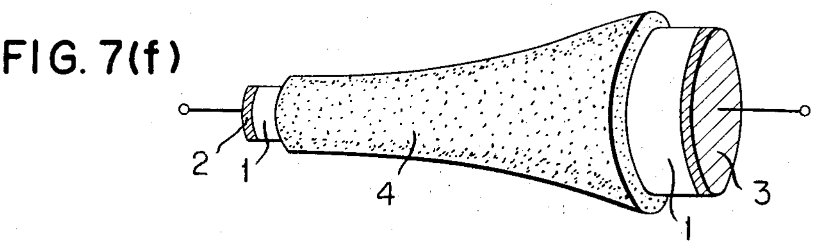
Figure 7G:
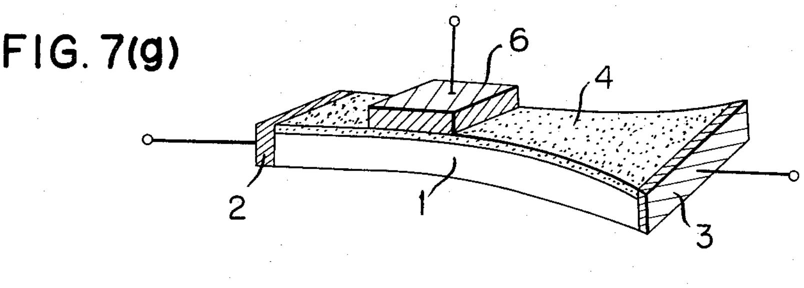
Figure 7H:
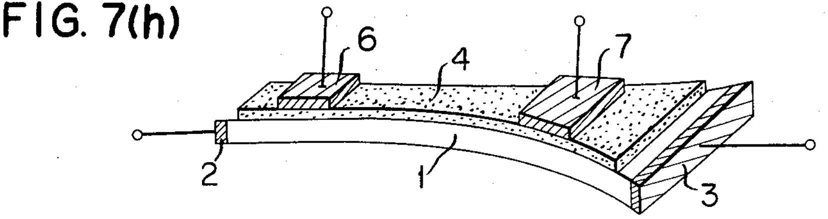
Figure 7I:
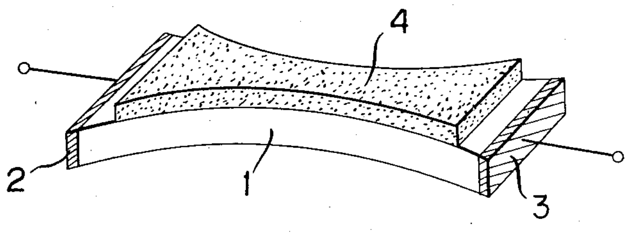
Figure 7J:
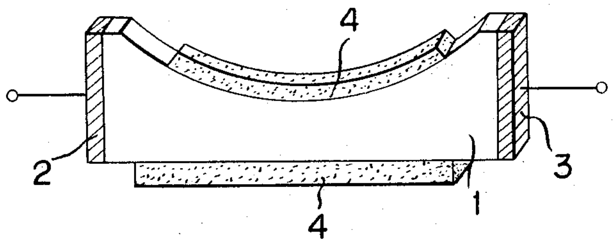
Figure 7K:
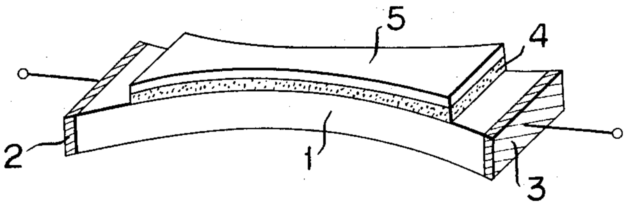
Figure 7L:
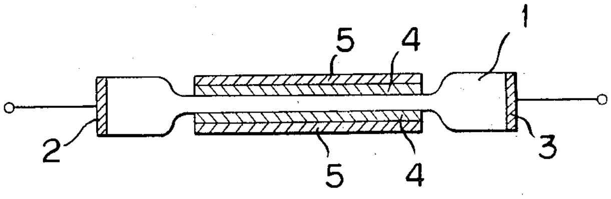
Figure 9A:
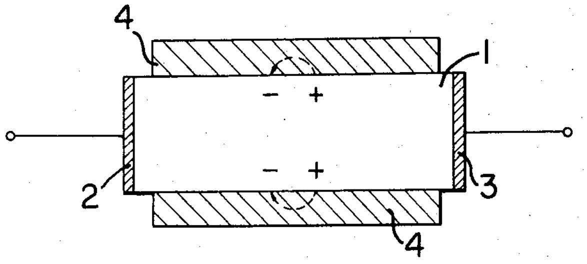
FIG. 9(*a*) shows schematically a principal embodiment of this invention.
Figure 9B:
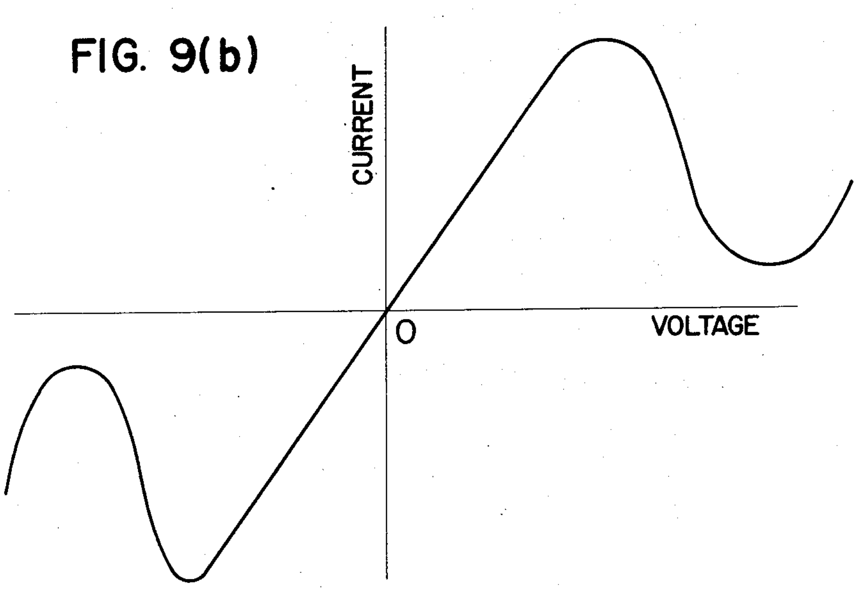
Figure 9C:
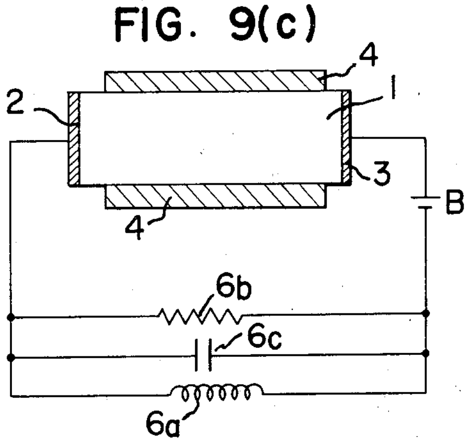
Figure 9D:
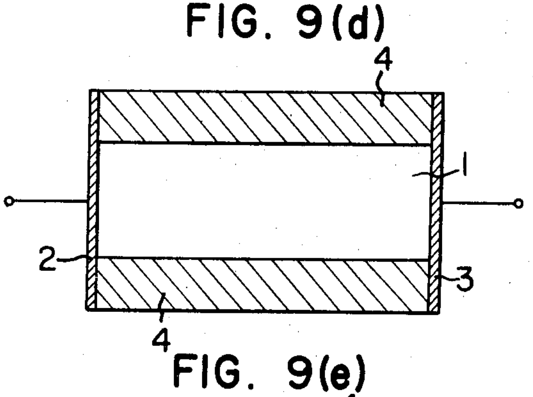
Figure 9E:
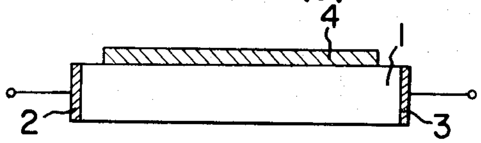
Figure 9F:
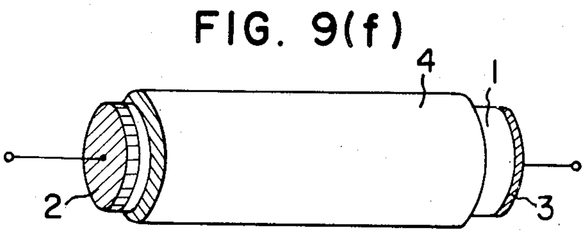
Figure 9G:
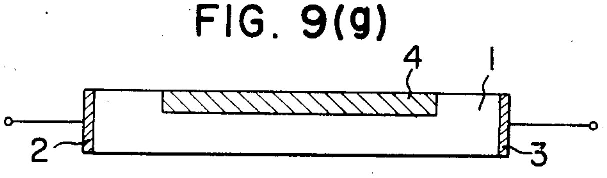
Figure 9H:
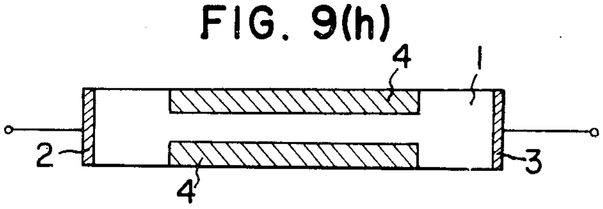
Figure 9I:
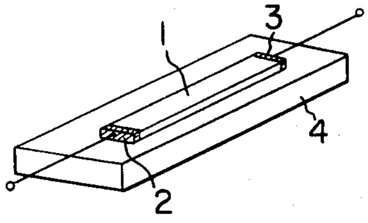
Figure 9J:
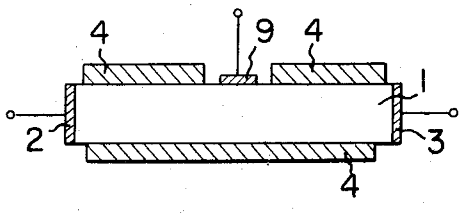
Figure 9K:
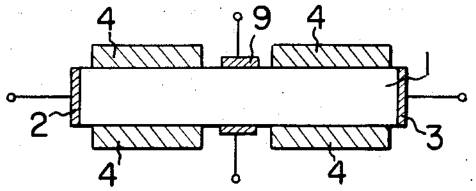
Figures 9L, 9M:
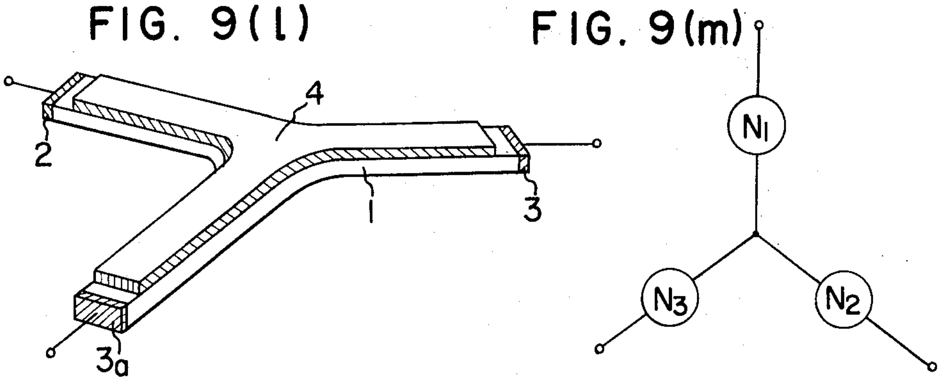
Figure 9N:
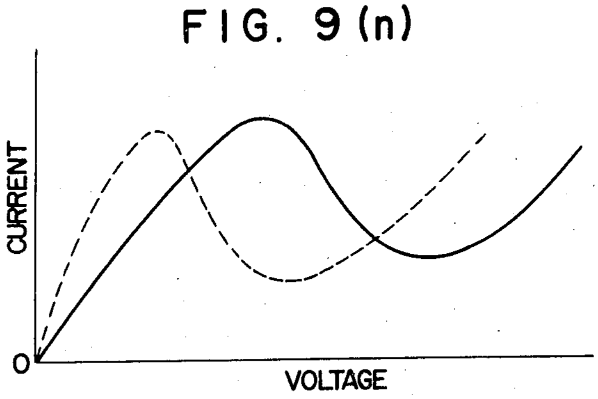
Figure 9O:
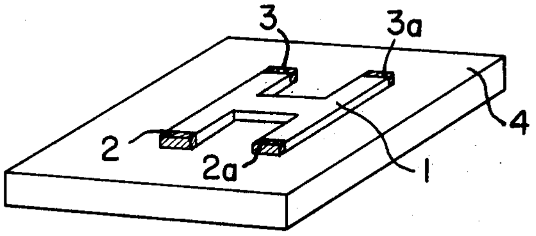
Figure 9P:
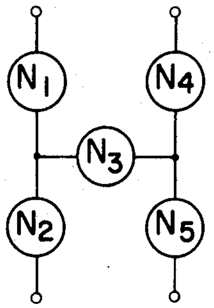

The above described feature indicates that the negative-resistance solid state element having the third electrode 6 or 6*a* is capable of operating as a vacuum tube or a transistor. When an external tuning circuit 7 is connected across the ohmically attached electrodes 2, 3, as shown in FIG. 6(*a*), and a high d.c. voltage is applied simultaneously across the same electrodes in such a manner that the oscillation is just about to start, if pulse signal (FIG. 6(*b*)) is applied at the third electrode 6, this pulse signal will act as a trigger pulse for this oscillator circuit, and an oscillation will start in the same circuit. Likewise, the already started oscillation can be stopped by the application of another pulse voltage having the opposite polarity relative to that of the high d.c. voltage applied across the electrodes 2, 3 (FIG. 6(*c*)).

Thus, it is apparent that the negative-resistance solid state element having a third electrode which constitutes another novel embodiment of the present invention can operate similarly as a vacuum tube or transistor, and the signal voltage applied at the third electrode can be amplified or the oscillation therein can be started and stopped by the application of an impulsive voltage at the third electrode. Moreover, as was explained hereinbefore, the negative-resistance solid state element is operable at an extraordinarily shorter wave range at high power and high efficiency. Therefore, this type of solid state element can be applied to a wide variety of electronic equipment and more specifically to communicate equipment of millimeter and submillimeter wavelengths or in high-speed electronic computers.

In the forgoing description, the solid state element has been described as having two end portions along its longitudinal axis. However, it is apparent that the solid state element may be so configurated that it has three or more end portions as shown in FIGS. 8(*a*), 8(*b*), and 8(*c*). In these cases, by providing electrodes on each of these end portions, there is attained an advantageous feature whereby the negative differential conductivity between one pair of the electrodes can be controlled from other electrodes.

Alternatively, the metallic layer 5 may be omitted totally and a layer of dielectric material of high dielectric constant, for instance, $BaTiO_3$, may be employed at one side or both sides of the semiconductor element 1 as indicated in FIG. 3(*b*), and FIGS. 9(*a*) to 9(*p*), whereby the negative-resistance characteristic as described above may also be obtained.

Referring to FIG. 9(*a*) which illustrates another principle of this invention, a solid state element comprises a semiconductor element 1 as described above, dielectric members 4, and ohmic electrodes 2 and 3 attached to both ends of said semiconductor element 1, but without the metal layer 5 as in FIG. 2(*a*). In this solid state element, when a voltage higher than a certain critical value is applied across the electrodes 2 and 3, space charges tend to grow or develop to form a high field domain in the semiconductor element 1. However, since dielectric constant of the dielectric member 4 disposed on the surface of the semiconductor element 1 is higher than that of the semiconductor element itself, for example, from 10,000 to 12,000 in the case of $BaTiO_3$ in comparison with 12.5 of GaAs element, the electric lines of force due to the aforementioned space charges pass substantially through the dielectric members and do not increase the electric field in the semiconductor element 1 itself, thereby preventing formation of high field domain. In other words, since the dielectric constant of the dielectric member is high, the space charge in the semiconductor element 1 apparently assume the state of being short-circuited by means of the dielectric members, thus suppressing generation and growth of the space charges, as a result. Consequently, as a matter of fact, any appreciable amount of space charge is not produced. Even if some space charges are produced, these minor space charges do not impart any effective influence to the electric field distribution in the semiconductor element 1, so that when the electric field in the semiconductor element exceeds the critical value thereof, this solid state element exhibits a negative differential conductivity between the electric voltage and current across the electrodes 2 and 3, the voltage versus current relationship corresponding to characteristic between the electric field and electron velocity as shown in FIG. 9(*b*), as will be clearly understood from the construction of the solid state element, irrespective of polarity of the electric voltage applied thereto.

The solid state element described above and having the negative-resistance characteristic can be utilized, under an appropriate circuit condition, to cause oscillation or amplification operation. FIG. 9(*c*) illustrates an example of such applications, wherein a d.c. voltage is applied across the electrodes 2 and 3 by means of a d.c. power source B and a load resistor **6*b* and a tuning circuit consisting of a capacitor 6*c* and an inductor 6*a* are connected in parallel to both electrodes 2 and 3. According to the circuit arrangement of FIG. 9**(*c*), the solid state element causes an oscillation having a frequency determined by the circuit constant of the tuning circuit, whereby an alternating electric power is applied to the load resistor **6*b*. The solid state element of FIG. 9**(*a*) may be modified so that the dielectric members 4 are elongated so as to abut on the electrodes as shown in FIG. 9(*d*), only one surface of the semiconductor element 1 is provided with the dielectric member 4 attached thereto as shown in FIG. 9(*e*), the semiconductor element 1 is peripherally covered by a dielectric member 4 as shown in FIG. 9(*f*) or sectional area of the semiconductor element 1 is decreased except the portions near the electrodes 2 and 3 as shown in FIGS. 9(*g*) or 9(*h*). Of course, the above-mentioned modified constructions may be combined as necessary.

Figure 10A:
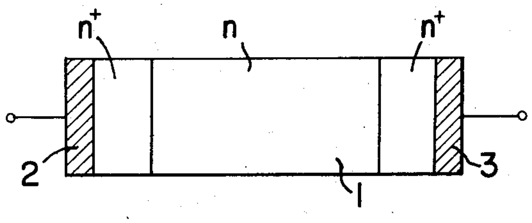
FIGS. 10(*a*) through 10(*d*) are views for describing the principle of the embodiments FIGS. 9(*g*) and 9(*h*), in which the cross-sectional area of the semiconductor element is made larger at the portions near the electrodes attached to ends of said semiconductor element.
Figures 10B, 10C, 10D:
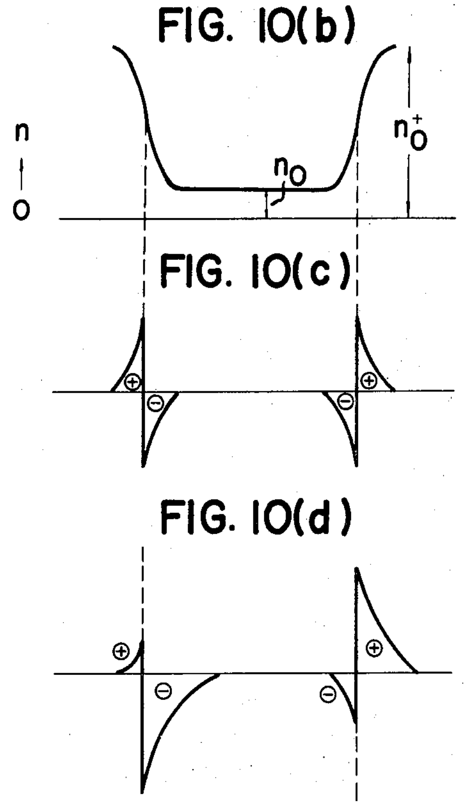

It was found that the negative-resistance characteristic cannot be obtained practically in many of the cases, wherein two metallic electrodes are ohmically attached to both ends of a semiconductor element having a uniform cross-section, as shown in FIGS. 9(*a*), 9(*d*) and 9(*e*). The reason thereof may be explained as follows:

When the electrodes made of a metal are ohmically attached to the semiconductor element, the junction portions of the semiconductor element with the electrodes will be alloyed with the electrode metal, and when the semiconductor element consists of, for instance, an N-type semiconductor, the alloyed regions form $n^+$ layers having a high electron density as shown in FIG. 10(*a*). The distribution of the electron density along the longitudinal axis of the semiconductor element 1 is shown in FIG. 10(*b*). As a result of such distribution, it will be understood that, as shown in FIG. 10(*c*), space charges are created at the portions where the distribution of the electron density abruptly changes. Thus, when the voltage applied across the element 1 having a uniform cross-section is gradually increased, the electron density in the N-type region near the negative electrode (hereinafter called cathode) increases as indicated in FIG. 10(*d*), and when the applied voltage exceeds a critical value, the electron density at this region grows up rapidly into a dipole layer, thereby to form a high field domain. As a result of various experiments, the suppression effect of a dielectric layer attached onto the outside surface of a semiconductor element such as GaAs against the high field domain is found to be significant at the earlier stage of domain formation, but negligible after the domain is once completely formed. This is easily understood from the fact that the electric lines of force produced by the space charges span between the space charges and anode through the dielectric layer, but it closes within the semiconductor between positive and negative space charges of a dipole layer, once it is completely formed. In this case, therefore, the space charges created near the cathode complete their growth into the high field domain prior to the arrival at the portion of the semiconductor element underlying the dielectric layer, whereby the existence of the dielectric layer can exhibit little influence on the creation of the high field domain and no appreciable negative differential conductivity can be obtained. This disadvantage can be effectively eliminated by the constructions as illustrated in FIGS. 9(*g*) and 9(*h*), wherein the cross-sectional areas of the portions near the electrodes ohmically attached thereto are made larger than that of the intermediate portion of the semiconductor element. By this construction, only the electric field at the intermediate portion of the semiconductor element, said portion having decreased cross-sectional area, can be brought about the critical value. However, since in this portion of the semiconductor element there is no space charge, growth of the space charges, which is created due to some nonuniformity of the material when an electric field above the critical value is applied thereto, is suppressed due to existence of the dielectric member. Consequently, according to the solid state element as illustrated in FIGS. 9( *g*) and 9(*h*), a large negative-resistance is created between the ends of the semiconductor element. This fact facilitates effective application of the solid state element to oscillation and amplification operations. According to the constructions as illustrated in FIG. 9(*g*) and 9(*h*), the space charges generated at the portion near the ohmic electrodes by an abnormal high electric field can be effectively suppressed. Furthermore, the solid state element as illustrated in FIG. 9(*e*) may be modified so as to be shown in FIG. 9(*i*), in which a semiconductor layer 1 is adhered onto a surface of a dielectric member 4, whereby a solid state element having an excellent negative differential conductivity of N-type can be also obtained.

The solid state element as illustrated in FIG. 9(*a*) can be modified as shown in FIGS. 9(*j*) and 9(*k*), in which the numerals 1, 2, 3, and 4 indicate, respectively, the same or equivalent members 1, 2, 3 and 4 of the embodiment of FIG. 9(*a*), and the numeral 9 indicates an electrode for applying an electric voltage thereto. FIG. 9(*l*) relates to the case having three electrodes 2, 3 and 3*a* and FIG. 9(*o*) relates to the case having four electrodes 2, 3, 2*a* and 3*a*. According to the embodiment of FIG. 9(*j*), negative differential conductivity between the electrodes 2 and 3 can be easily controlled by an electric voltage of the center electrode 9, and also according to the embodiment of FIG. 9(*h*), negative differential conductivity between the electrodes 2 and 3 can be easily controlled by an electric voltage of any one of the electrodes 9.

FIG. 9(*l*) illustrates a further modification of the solid state element of FIG. 9(*a*). This modified solid state element consists of a Y-shaped semiconductor element 1, a Y-shaped dielectric member 4 adhered onto said semiconductor element 1 and three electrodes 2, 3 and 3*a* attached to three ends of said semiconductor element 1. This embodiment can be regarded so as to be equivalent to the case, in which three negative-resistance elements $N_1$, $N_2$ and $N_3$ having, respectively, negative-resistance characters corresponding to those of arms of the semiconductor element 1 are connected as shown in FIG. 9(*m*). According to the embodiment of FIG. 9(*l*), negative differential conductivity between two electrodes can be controlled by electric potential of the other remaining electrode, for example, it is possible to vary the character shown by broken line to the character shown by full line in FIG. 9(*n*).

FIG. 9(*o*) illustrates a still further modification of the embodiment of FIG. 9(*a*). This solid state element consists of a dielectric plate 4, an H-shaped semiconductor element 1 attached to one surface of said dielectric plate 4, and four electrodes 2, 3, 2*a* and 3*a* attached to four ends of said semiconductor element 1. This embodiment can be regarded so as to be equivalent to the case, in which five negative-resistance elements $N_1$, $N_2$, $N_3$, $N_4$ and $N_5$ having, respectively negative differential conductivity corresponding to those of arms of the semiconductor element 1 are connected as shown in FIG. 9(*p*).

Although the negative-resistance solid state elements according to the present invention have been described as having elongated configurations of uniform cross-sectional area, it has also been found that the distribution of the electrical field internal of the solid state element at the time when the applied high d.c. voltage exceeds the critical value is altered from the substantially uniform electric field to that as indicated in FIG. 7(*a*) and that the really affective operating portion is limited to the part near the anode. To obviate this disadvantage, the configuration of the solid state element may be so determined that the cross-sectional area of the element near the anode is larger than the rest of the portions as shown in FIGS. 7(*b*) through 7(*h*), or, for the application wherein a high d.c. voltage is applied across the element, the cross-sectional area near both ends thereof may be made larger as shown in FIGS. 7(*i*), 7(*j*), and 7(*k*). A more versatile form of the element is shown in FIG. 7(*l*).

Actual examples of the semiconductor element as illustrated in FIG. 9(*a*) are shown in the following.

A long bar GaAs element was prepared from material of doping density $n_o = 7.6 \times 10^{14} cm^{-3}$, mobility $\mu = 6{,}340\ cm^2/Vs$, and resistivity $\rho = 1.28\ \Omega$ cm. The GaAs bar was 1 mm long overall and 1 mm wide. The length of 700 $\mu$m from one end was made thinner to about 60 to 80 $\mu$m being slightly tapered in thickness. Ohmic contacts were made by tin alloying at both ends. The effective $n_o l$ product was about $5 \times 10^{13}\ cm^{-2}$. The element apparently exhibited a spike waveform due to the travelling high field domain. However, when two sheets of dielectric material of $BaTiO_3$ of 300 $\mu$m thick and of relative permittivity of 12,000 were placed on the upper and lower surfaces of the thinner part of the GaAs element, and a pulse voltage was applied to the element mounted in a coaxial line system so as to make the thicker end an anode, the travelling domain mode current oscillation disappeared, and the current remained almost constant up to 1.5 times the threshold voltage, under which condition the voltage/current characteristic showed a negative differential resistance during the pulse duration. The entire configuration and construction of the element in this example is as shown in FIG. 7(*e*).

In another example, a planar GaAs element of 1 mm long, 2 mm wide, and 100 microns thick from material of doping density $n_o = 5 \times 10^{13}\ cm^{-3}$. Metal contacts were placed by vacuum evaporation at an interval of 1 mm between them. To this GaAs element, a sheet of dielectric material of $BaTiO_3$ having a thickness of 500 $\mu$m and different relative permittivity of 3,000 and 1,000, and $SrTiO_3$ having relative permittivity of 300 was attached. When a voltage of 320 V is applied to one of the electrodes, if there is no dielectric member attached, high field domain is generated due to the Gunn oscillation. However, if there is the dielectric member of the above specified thickness and permittivity, the Gunn oscillation is perfectly suppressed.

Figure 11A:
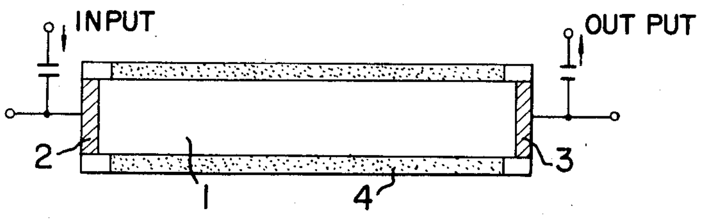
FIGS. 11(*a*), 11(*b*) and 11(*c*) show different modifications of the embodiment of FIG. 9(*a*), in which input and output electrodes are provided.
Figure 11B:
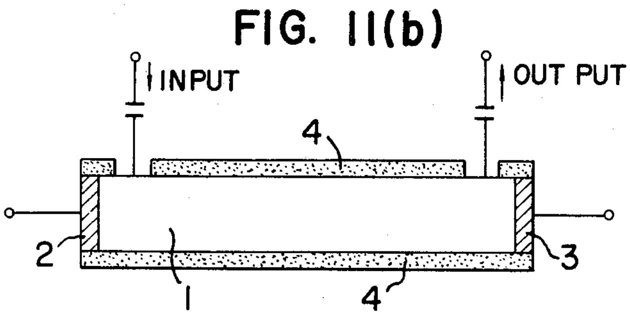
Figure 11C:
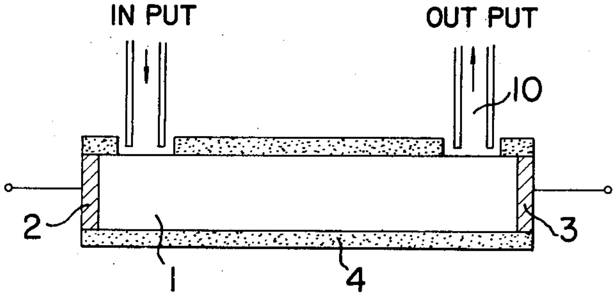
Figure 12A:
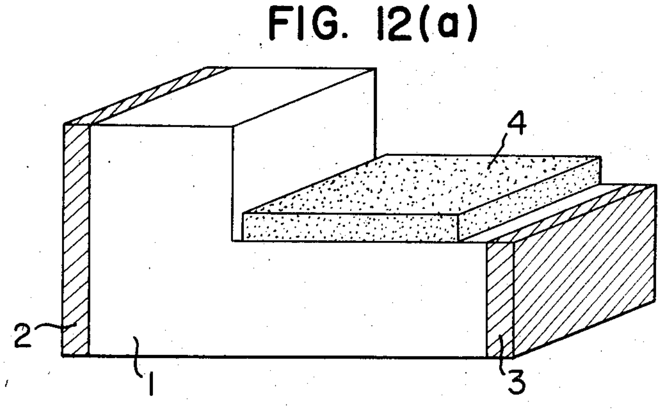
FIGS. 12(*a*), 12(*b*) and 12(*c*) show different modifications of the embodiment of FIG. 9(*a*), in which cross-sectional area of the portion of the semiconductor element near one electrode is made larger than that of the portion near the other electrode.
Figure 12B:
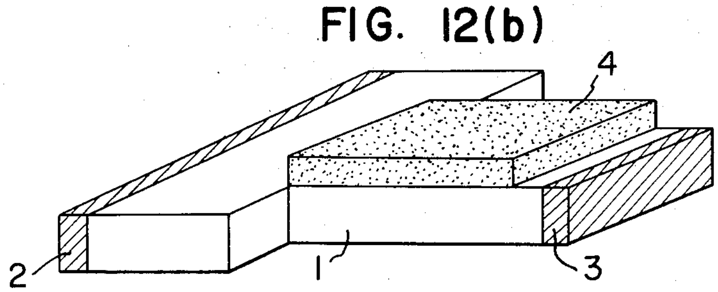
Figure 12C:
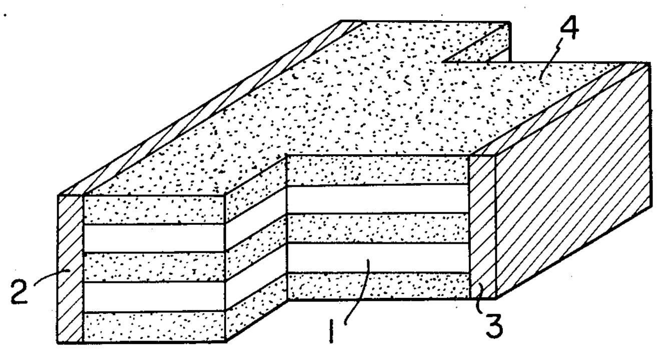
Figure 13A:
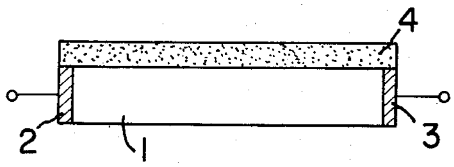
FIGS. 13(*a*) illustrates a further modification of the embodiment of FIG. 9(*a*)
Figure 13B:
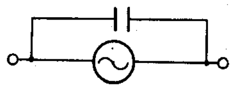
Figure 13C:
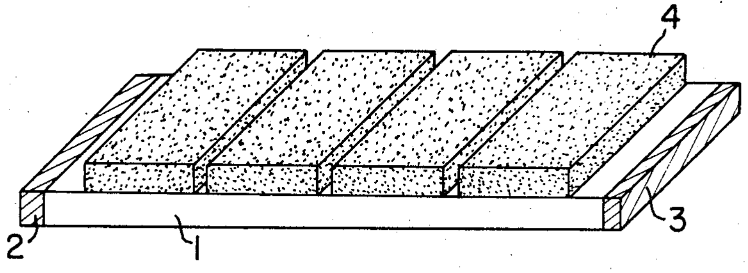
Figure 13D:
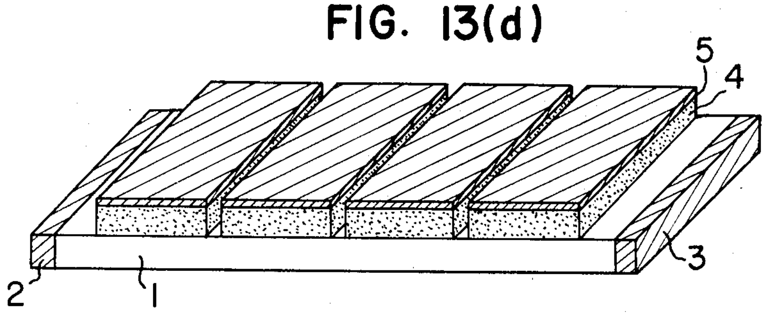
Figure 13E:
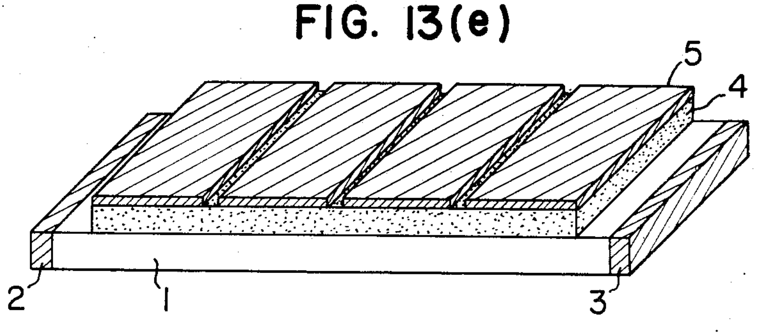

The solid state element of FIG. 9(*a*) can be effectively utilized as an amplifier element by applying an input signal to an input electrode connected to the cathode or to the semiconductor element 1 at its portion near said cathode as shown in FIGS. 11(*a*) and 11(*b*). According to these embodiments, when an input signal is applied to the input electrode the input signal is amplified during its propagation through the semiconductor element 1 so that an amplified output signal can be led out from the output electrode connected to the anode or to the semiconductor element 1 at its portion near said anode. In this case, the input and/or output signal may be coupled to the semiconductor element 1 in not only capacitive, but also ohmic or inductive manner. The type of coupling may be varied depending on the configuration and dimension of the element and associated parts. As shown in FIG. 11(*c*), for example, a waveguide 10 may be used as a lead of said input signal or output signal. In the embodiments of this invention, as illustrated in FIGS. 12(*a*) and 12(*b*), sectional area of the semiconductor element 1 is made to be asymmetric along its whole length, that is, cross-sectional area at the portion near one electrode is made larger than that of the portion near the other electrode. In general, as described already, when ohmic electrodes are attached to both ends of a solid body exhibiting a negative differential conductivity when it is placed in a high electric field, space charge is generated at junction portions between said electrodes and solid body, and said space charge grows with increase of the applied electric voltage causing production of said high electric field when electric charge of said solid body becomes negative, thereby to form a high field domain which is turn transfers through the internal portion of the semiconductor. However, when such a dielectric member having a high dielectric constant as $BaTiO_3$ is attached onto the surface of the semiconductor, generation or growth of space charge is suppressed even when a high electric field is applied to the semiconductor, whereby it becomes to have a negative differential conductivity. However, when the electric field at the portion near the ohmic electrode is sufficiently high, and the space charge near said portion grows up to dipole layer, said suppressive effect of the dielectric member attached to the surface of the solid body would become very inferior. According to the structures of FIGS. 12(*a*) and 12(*b*), the electric field near the ohmic electrode 2 is lower than that near the ohmic electrode 3, because cross-sectional area of the portion near the electrode 2 is larger than that of the portion near the electrode 3, so that when a d.c. voltage is applied across the elecgrodes 2 and 3 so as to make polarity of the electrode 2 negative, the electric field near the electrode 3 becomes predominant, whereby the space charges which are created and grown due to action of the dielectric member 4 is suppressed, thus establishing N-type negative-resistance characteristic between the electrodes 2 and 3. On the contrary, when a d.c. voltage is applied across the electrodes 2 and 3 so as to cause negative polarity of the electrode 2, the electric field at the portion near the electrode 2 is relatively high, so that the space charge existing at said portion grows rapidly up to a dipole layer, whereby a high field domain is produced, thus establishing no favorable negative differential conductivity between the electrodes and establishing a negative differential conductivity with respect to only one directional polarity. A solid state element having one directional negative differential conductivity as described above is often required for the case, in which for example, function of automatic discrimination of polarity is required. This requirement can be effectively satisfied by the embodiments as described in connection with FIGS. 9(*a*) and 9(*b*). In the embodiments of FIGS. 9(*a*) and 9(*b*), sectional area of the semiconductor element 1 may be varied by making the heights at portions near the electrodes differ from each other. Furthermore, for the purpose of obtaining a higher power device, a plurality of the solid state elements may be laminated as shown in FIG. 12(*c*).

Figure 14A:
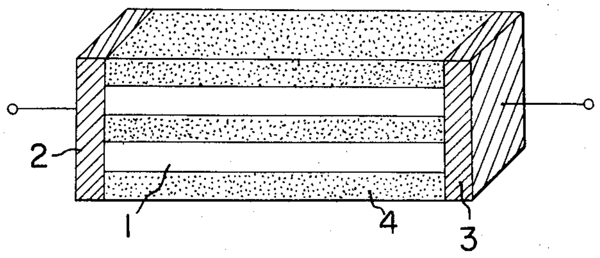
FIGS. 14(*a*), 14(*b*) and 14(*c*) illustrate a high power device consisting of a plurality of solid state elements according to this invention.
Figure 14B:
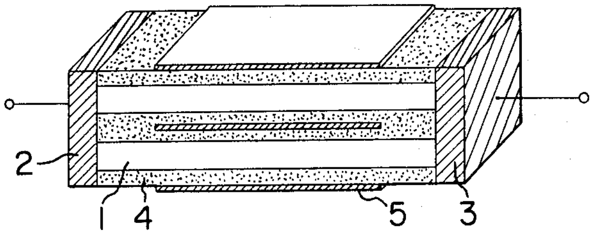
Figure 14C:
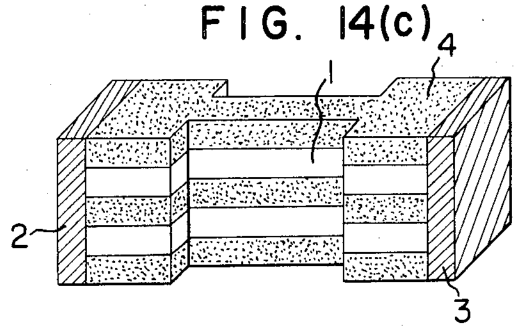
Figure 13F:
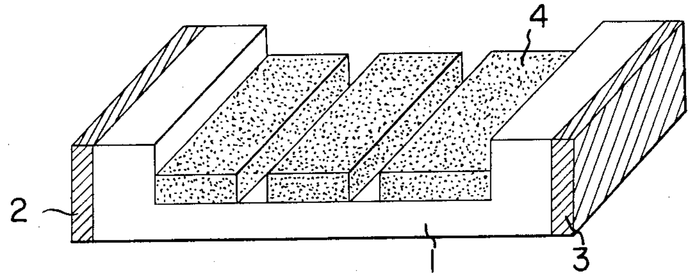

It has been experimentally found that in the embodiments as illustrated in FIGS. 2(*a*), 3(*a*), 3(*b*) and (9*a*), if the dielectric member 4 or the metallic layer 5 and dielectric member 4 are not extended so as to cover the ohmic electrodes also, the effect of suppressing generation of the high field domain is relatively low, so that it is required to cover the semiconductor element 1 with the dielectric member or the metallic layer up to the region longer than the portions having the negative differential conductivity, as shown in FIG. 13(*a*). According to the structure as illustrated in FIG.13(*a*), since the dielectric member 4 covers the junction portions between the metal electrodes and the semiconductor element 1, effective suppression of the space charges at the regions near the electrodes can be attained without adopting complicated structure. In this case, however, since the dielectric member covers ohmic electrode portions or inactive region of the semiconductor, the micro-wave power which has been oscillated or amplified is short-circuited, as clearly understood from the circuit of FIG. 13(*b*) which is an equivalent circuit of the element of FIG. 13(*a*), whereby efficiency of the solid state element is remarkably decreased. Such disadvantage as described above can be effectively eliminated by providing air gaps on the dielectric member 1 or metal layer 5 in the direction perpendicular to the direction of applied d.c. electric field, as shown in FIG. 13(*c*) and 13(*d*). In the case of solid state element of FIG. 13(*d*) the dielectric member 1 may not be provided with the air gaps. According to the structure as shown in FIGS. 13(*c*) and 13(*d*), leakage loss of any micro-wave power is effectively suppressed, whereby very efficient oscillation or amplification of any micro-wave can be made possible. Of course, air gaps as described above may be provided in the different embodiment of this invention, for example, as shown in FIG. 13(*e*). The single solid state element such as illustrated in FIGS. 2(*a*), 3(*b*) and 9(*a*) can be applied with relatively low power. However, when a plurality of single solid state elements are laminated as shown in FIGS. 14(*a*), 14(*b*) and 14(*c*), electric power of the laminated device can be remarkably increased while maintaining the whole characteristic of the device at the characteristic equal to that of each single solid state element.

Figures 15A, 15B, 15C, 15D, 15E, 15F, 15G, 15H:
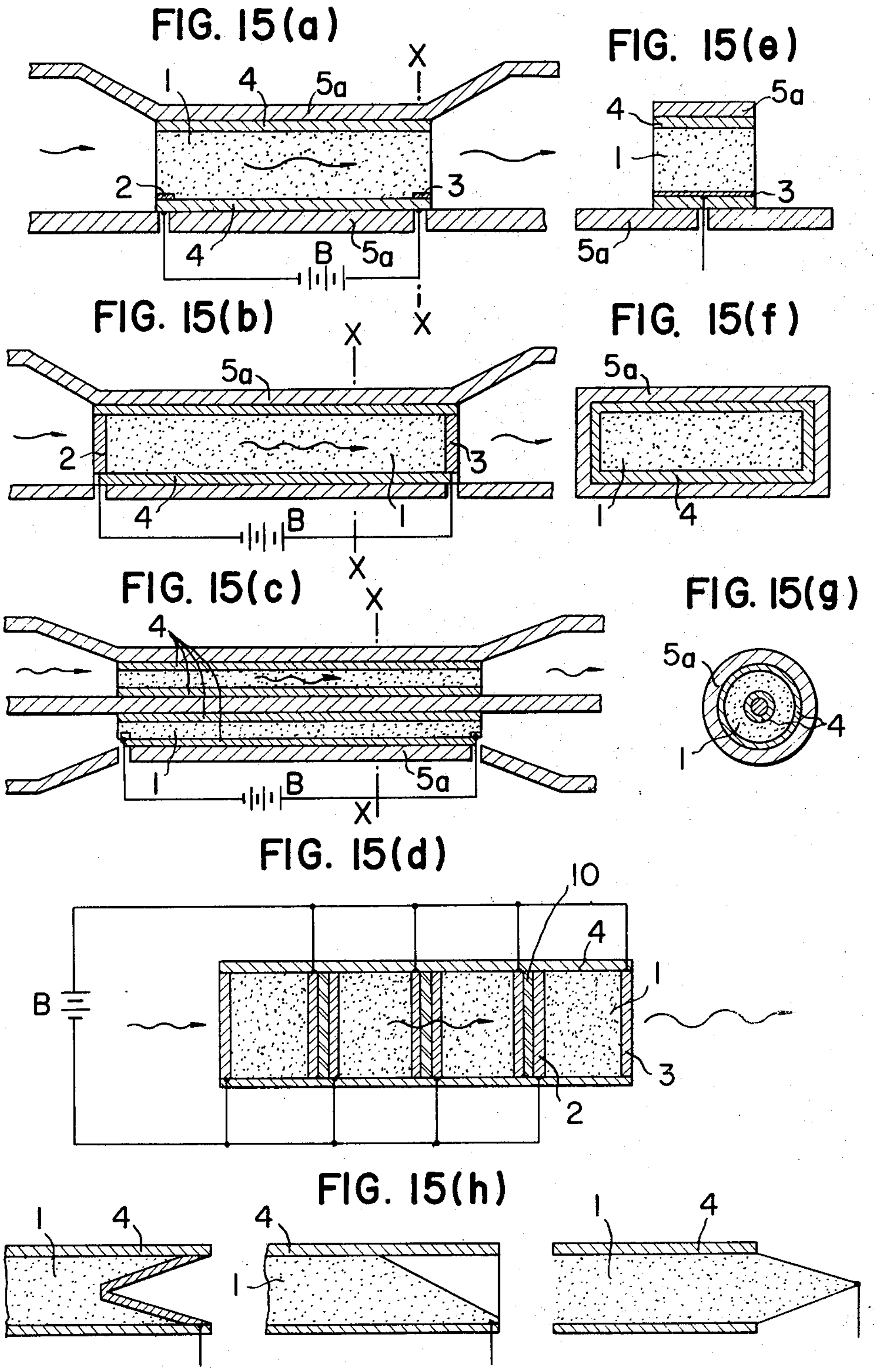
FIGS. 15(*a*), 15(*b*), 15(*c*) and 15(*d*) are different embodiments of an amplifier conductor, to which an embodiment of this invention is applied.

In FIG. 15(*a*), a strip line forming a transmission line to which a solid state element of this invention is applied is illustrated, in which a solid state element comprising a semiconductor element 1 having a negative-resistance characteristic, dielectric layers 4 attached to both surfaces of said semiconductor element, and electrodes 2 and 3 attached to end portions of said semiconductor element is arranged between two metallic conductors 5*a*, said electrodes being applied with a d.c. voltage B. According to structure of the strip line of FIG. 15(*a*), the space charges or high field domain produced in the semiconductor element 1 is suppressed by the dielectric layers and metallic conductors surrounding said semiconductor element, so that said semiconductor element becomes stable and exhibits "-negative differential conductivity." In general, if an electric wave is introduced into an ordinary semiconductor element having a positive-resistance characteristic, said electric wave progressively attenuates according as it enters into and propagates through the semiconductor element. But, when the conductivity of the semiconductor element is negative with respect to any microwave, the electric wave is rather amplified according as it propagates through the semiconductor element. Accordingly, if a signal wave is introduced towards negative electrode (left side in the drawing) of one semiconductor element of the strip line as shown by arrow in FIG. 15(*a*), said signal wave is amplified in the semiconductor element and reaches the positive electrode in the state having been amplified. In this case, it is necessary to reduce the space interval between the metallic conductors covering the semiconductor element so as to establish impedance matching of the line. Furthermore, for the purpose of decreasing wave reflection at the junction portions between the semiconductor element and air, it is effective to form the end portion of the semiconductor element as shown in FIG. 15(*h*). The embodiment of FIG. 15(*a*) can be modified, as shown in FIGS. 15(*b*), 15(*f*); FIGS. 15(*c*), 15(*g*). According to constructions as shown in FIGS. 15(*a*), 15(*b*) and 15(*c*), amplification factor is in proportion to length and electron density of the semiconductor element. However, strength of the d.c. field necessary for creating the above-mentioned large amplification becomes very high, so that the d.c. voltage applied to the electrodes should be made high, whereby difficult problem relating to insulation and power source occur. Such disadvantage can be eliminated by adopting the construction such as illustrated in FIG. 15(*d*), in which a plurality of solid state elements each comprising a semiconductor element 1, electrodes 2 and 3 attached to ends of said element and dielectric layers 4 adhered onto the surfaces of said element are arranged in series in the wave-propagation direction through interposed transparent layers 10 (for instance, Teflon) and all electrodes are connected in parallel to a d.c. voltage. According to the construction of FIG. 15(*d*), the necessary d.c. voltage becomes low and treatment thereof becomes easy.

According to the embodiments such as illustrated in FIGS. 15(*a*), 15(*b*), 15(*c*) and 15(*d*), amplification of any electric wave up to very high frequency can be made easy and their operating life is almost permanent so that their stabilities and reliabilities are very high, thus rendering great contribution to various fields such as electric communication and electronic industries.

We claim:

1. A negative-resistance solid state element comprising: a solid body composed of semiconductor material having at least two ends and exhibiting a negative differential conductivity when placed in a high electric field; an electrode ohmically attached to each of said ends; means for applying a voltage across said electrodes; and at least one dielectric member covering at least one surface portion of said solid body and having a permittivity sufficiently higher than that of said solid body to effectively shortcircuit space charges created in said solid body during the application of said voltage thereby preventing high electric field domains from nucleating therein and establishing a negative resistance across said electrodes.

2. A negative resistance solid state element comprising: a solid body composed of semiconductor material having at least two ends and exhibiting a negative differential conductivity when placed in a high electric field; an electrode ohmically attached to each of said ends; means for applying a voltage across said electrodes; at least one dielectric member covering at least one surface portion of said solid body; and at least one metal layer provided on said dielectric member cooperative therewith, capacitance created by said dielectric member and the metal layer being effective to shortcircuit space charges created in said solid body during the application of said voltage, thereby preventing high electric field domains from nucleating therein and establishing a negative resistance across said electrodes.

3. A negative-resistance solid state element according to claim 1, in which the cross-sectional area of said solid body at portions near said electrodes differs from the cross-sectional area at remaining portions thereof.

4. A negative-resistance solid state element according to claim 1, wherein the cross-sectional area of said solid body is enlarged at regions near said electrodes in comparison with the cross-sectional area at remaining regions thereof.

5. A negative-resistance solid state element according to claim 1, wherein said solid body is provided with an input electrode disposed near one said electrode and an output electrode disposed near the other of said electrodes.

6. A negative-resistance solid state element as claimed in claim 1, further including at least one control element ohmically attached to said solid body.

7. A negative-resistance solid state element as claimed in claim 2, further comprising at least one control element capacitively attached to said solid body.

8. A negative-resistance solid state element as claimed in claim 2, wherein a pair of output electrodes are provided on the surface of the solid body near the two ends thereof, said output electrodes being reactively coupled with said solid body.

9. A negative-resistance solid state element as claimed in claim 1, wherein the cross-sectional area of one end portion of said solid body is enlarged in comparison with the remaining portions thereof.

10. A negative-resistance solid state element as claimed in claim 2, wherein the cross-sectional area of said solid body is enlarged at both said ends in comparison with the remaining portions thereof.

11. A negative-resistance device consisting of a plurality of laminated negative-resistance solid state elements, each comprising: a solid body composed of semiconductor material having at least two ends and exhibiting a negative differential conductivity when placed in a high electric field; electrodes ohmically attached to said ends; means for applying a voltage across said electrodes; and at least one dielectric member covering at least one surface portion of said solid body to effectively shortcircuit space charges created in said solid body during the application of said high electric field thereby preventing high electric field domains from nucleating therein and establishing a negative resistance across said electrodes.

12. A negative-resistance device consisting of a plurality of laminated negative-resistance solid state elements, each comprising: a solid body composed of semiconductor material having at least two ends and exhibiting a negative differential conductivity when placed in a high electric field; electrodes ohmically attached to said ends; means for applying a voltage across said electrodes; at least one dielectric member covering at least one surface part of said solid body to effectively shortcircuit space charges created in said solid body during the application of said voltage thereby preventing high electric field domains from nucleating therein and establishing a negative resistance across said electrodes; and at least one metal layer superposed on said dielectric member coacting therewith to effectively suppress high electric field domains in said solid body.

13. A negative-resistance solid state element according to claim 1, wherein a plurality of dielectric members are provided on said solid body with a small air gap therebetween in a direction perpendicular to the direction of current flow in said solid body.

14. A negative-resistance solid state element according to claim 2, wherein a plurality of dielectric members and a plurality of metal layers are provided on said solid body with a small air gap therebetween in a direction perpendicular to the direction of current flow in said solid body.

15. A negative-resistance solid state element according to claim 2, wherein a plurality of metal layers are provided on said dielectric layer with a small air gap therebetween in a direction perpendicular to the direction of current flow in said solid body.

16. A negative-resistance solid state element according to claim 1, wherein the dielectric member extends sufficiently to cover the junction portions between said solid body and said ohmically attached electrodes.

17. A negative-resistance solid state element according to claim 2, wherein said dielectric member and said metal layer extend lengthwise sufficiently to cover the junction portions between said solid body and said ohmically attached electrodes.

18. A negative-resistance solid state element according to claim 2, in which the cross-sectional area of said solid body at portions near said electrodes differs from the cross-sectional area at remaining portions thereof.

19. A negative-resistance solid state element according to claim 2, wherein the cross-sectional area of said solid body is enlarged at its regions near the electrodes in comparison with the rest of the regions thereof.

20. A negative-resistance solid state element according to claim 2, wherein said solid body is provided with an input electrode disposed near the cathode thereof and with an output electrode disposed near the anode thereof.

21. A negative-resistance solid state element as claimed in claim 2, wherein the cross-sectional area of one end portion of the solid body near the anode is enlarged in comparison with the rest of the portions thereof.

22. A negative-resistance solid state element as claimed in claim 2, wherein the cross-sectional area of both end portions of the solid body near the anode and cathode is enlarged in comparison with the rest of the portions thereof.

23. A negative-resistance solid state device comprising: an elongated semiconductor body having a pair of longitudinally spaced-apart ends operable in a first mode to develop therein travelling electric field domains successively travelling from one said end to the other said end and a second mode exhibiting a negative differential conductivity; an electrode ohmically affixed to each said end, means for applying a voltage during operation of the device between said electrodes effective to bias said elongated semiconductor body into said first mode; and suppressing means for effectively suppressing said travelling electric field domains to convert said elongated semiconductor body into said second mode.

24. A device according to claim 23, wherein said suppressing means comprises a dielectric member having a permittivity higher than that of said semiconductor body disposed around at least a portion of the peripheral surface of said elongated semiconductor body.

25. A device according to claim 24, wherein said dielectric member extends longitudinally over at least a major portion of the length of said elongated semiconductor body.

26. A device according to claim 25, wherein said elongated semiconductor body has a different cross-sectional area near each said end than at remaining portions thereof.

27. A device according to claim 25, including a metallic layer superposed on the exterior of said dielectric member reactively coupled with said semiconductor body through said dielectric member.

28. A device according to claim 25, further including another electrode ohmically connected to said semiconductor body between said spaced-apart ends.

29. A device according to claim 25, further including another electrode reactively coupled with said semiconductor body at a location between said spaced-apart ends.

30. A negative-resistance solid state element as claimed in claim 1, further including at least one control element capacitively attached to said solid body.

31. A negative-resistance solid state element as claimed in claim 2, further including at least one control element ohmically attached to said solid body.

* * * * *